(12) United States Patent
Murtagh

(10) Patent No.: US 10,128,747 B2
(45) Date of Patent: Nov. 13, 2018

(54) FREQUENCY-CONTROLLED VOLTAGE SOURCE

(71) Applicant: Eta Compute, Inc., Westlake Village, CA (US)

(72) Inventor: Paul Murtagh, Westlake Village, CA (US)

(73) Assignee: Eta Compute, Inc., Westlake Village, CA (US)

( * ) Notice: Subject to any disclaimer, the term of this patent is extended or adjusted under 35 U.S.C. 154(b) by 0 days.

(21) Appl. No.: 15/886,056

(22) Filed: Feb. 1, 2018

(65) Prior Publication Data

US 2018/0254698 A1   Sep. 6, 2018

Related U.S. Application Data

(60) Provisional application No. 62/465,382, filed on Mar. 1, 2017.

(51) Int. Cl.
| | |
|---|---|
| *H02M 3/158* | (2006.01) |
| *G05F 1/40* | (2006.01) |
| *H02M 3/07* | (2006.01) |
| *G06F 15/82* | (2006.01) |
| *H03K 5/14* | (2014.01) |

(52) U.S. Cl.
CPC .............. *H02M 3/07* (2013.01); *G06F 15/82* (2013.01); *H03K 5/14* (2013.01)

(58) Field of Classification Search
CPC .............. H02M 3/07; H03K 5/14; G06F 15/82
See application file for complete search history.

(56) References Cited

U.S. PATENT DOCUMENTS

| | | | | |
|---|---|---|---|---|
| 7,414,450 | B2 * | 8/2008 | Luo | H02M 3/07 327/105 |
| 8,572,539 | B2 | 10/2013 | Cortadella et al. | |
| 8,618,783 | B2 * | 12/2013 | Oki | H02M 3/156 323/222 |
| 8,629,668 | B2 * | 1/2014 | Menegoli | H02M 3/1584 323/272 |
| 2014/0250313 | A1 | 9/2014 | Marr et al. | |

* cited by examiner

*Primary Examiner* — Kenneth B Wells
(74) *Attorney, Agent, or Firm* — SoCal IP Law Group LLP; John E. Gunther; Angelo Gaz

(57) ABSTRACT

Voltage source circuits, asynchronous processing systems and methods are disclosed. A voltage source circuit includes a capacitor storing an operating voltage for an asynchronous processor. A frequency comparator compares a frequency reference and a feedback signal indicative of an operating frequency of the asynchronous processor to determine whether or not the operating frequency is less than a target frequency. When operating frequency is less than the target frequency, a charge pump adds charge to the capacitor.

21 Claims, 6 Drawing Sheets

FREQUENCY-CONTROLLED VOLTAGE SOURCE

RELATED APPLICATION INFORMATION

This patent claims priority from provisional patent application 62/465,382, filed Mar. 1, 2017, titled FREQUENCY CONTROLLED BUCK REGULATOR.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to power converters, and specifically to semi-regulated voltage sources for use with asynchronous digital logic circuits.

Description of the Related Art

In this patent, the term "processor" means a digital circuit that performs some sequence of operations. A processor may typically, but not necessarily, execute stored instructions to accomplish its assigned function. Processors that typically execute stored instructions include microprocessors, microcontrollers, digital signal processors, and coprocessors. Processors that do not execute stored instructions include single-purpose processors such as encryption engines and fast Fourier transform engines. The sequence of operations performed by such engines may be controlled, for example, by a hardware state machine rather than stored instructions.

Most digital processors in use today are synchronous, which is to say various elements within the digital processor operate synchronously in response to a common clock signal. The power consumption of a synchronous processor depends on the complexity of the processor (i.e., the number of gates and other functional elements), the clock rate, and the operating voltage. In general, higher operating speed requires higher operating voltage. To minimize the power consumption of a synchronous digital logic circuit, the circuit may be operated at the lowest possible clock rate consistent with the circuit function and the lowest voltage that will support operation at that clock rate. The methodology and tools for designing synchronous logic circuits are well developed, so long as the processor circuit is designed to operate from a power supply voltage substantially above the threshold voltage of the transistors comprising the processor. However, to achieve the lowest possible power consumption, it may be preferable to operate a digital logic circuit at a voltage near or below the transistor threshold voltage. While research papers have shown that near-threshold operation of synchronous processors (i.e., operation with a power supply voltage near the transistor threshold voltage) may be possible, the delay of near-threshold and below-threshold logic gates may vary by a factor of up to 100 over an operating temperature range. Further, the delay may vary by a factor of five or more between gates at a single temperature. As a consequence, it is difficult, if not impossible, to estimate the minimum required clock frequency for near-threshold voltage operation of synchronous logic circuits.

Asynchronous processors circuits do not operate from a common clock signal, such that the delay of an asynchronous processor is determined solely by the cumulative delay of the gates and other logic elements within the asynchronous processor. Asynchronous processors are typically operated in a cyclic manner. A cycle is initiated when input data is provided to the processor. The processor then performs some operation upon the input data, with the time required to perform the operation determined by the accumulated delays of the logic circuits within the processor. When the operation is completed, and all of the outputs of the processor have assumed their final values, a feedback or acknowledge signal may be generated to indicate completion of the current processing cycle and readiness to begin the next cycle.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Description of Apparatus

Asynchronous processors may be used in battery-powered applications, such as remote sensing, where an objective is to minimize power consumption by operating the processor at the lowest speed sufficient to perform the required functions. To this end, the processor may be operated from a supply voltage provided from a voltage source controlled by the processor operating speed.

Figure 1:
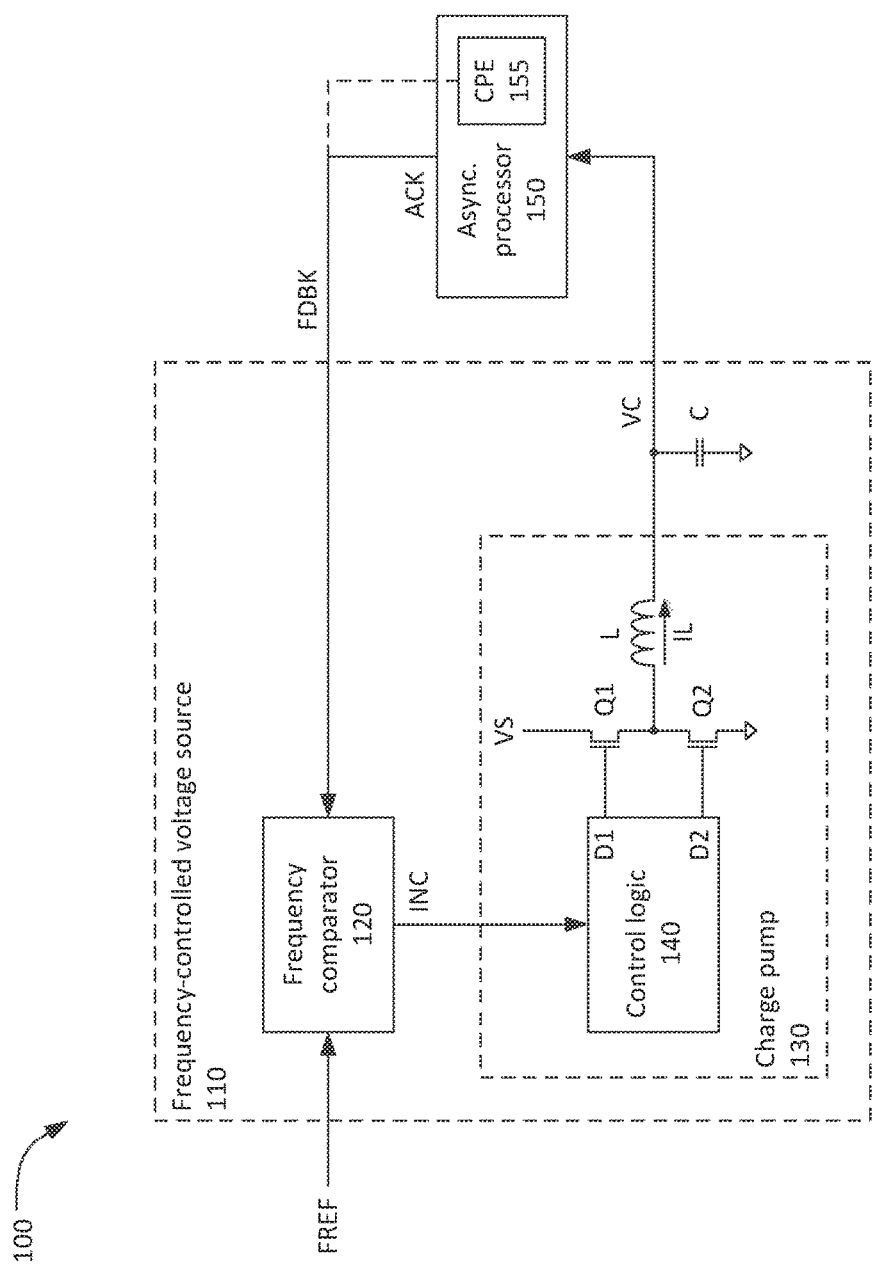
FIG. 1 is a block diagram of a processing system including a frequency-controlled voltage source.

FIG. 1 is a block diagram of a processing system 100 including a frequency-controlled voltage source 110 and an asynchronous processor 150. The frequency-controlled voltage source 110 converts a supply voltage VS into a semi-regulated voltage VC used to power all or parts of the asynchronous processor 150. The supply voltage VS may be provided by a battery, a fuel cell, a solar panel or some other source. The asynchronous processor 150 may be a collection of asynchronous logic circuits that are collectively capable of performing one or more functions. The asynchronous processor 150 may perform some or all functions by executing stored instructions. The asynchronous processor 150 may perform some or all functions without the use of stored instructions. For example, the asynchronous processor 150 may be or include a state machine that perform a function such as encryption or decryption.

The frequency-controlled voltage source 110 includes a frequency comparator 120 and a charge pump 130 that charges a capacitor C. The voltage VC across capacitor C is used to power the asynchronous processor 150. The voltage VC is determined by the equation VC=Q/C, where Q is the charge stored in capacitor C and C is the capacitance of capacitor C. For ease of description, capacitor C can be considered to store the voltage VC.

The frequency comparator 120 receives a frequency reference signal FREF and a feedback signal FDBK, where a frequency of FDBK is representative of an operating speed of the asynchronous processor 150. The frequency reference signal FREF provides a reference by which the frequency comparator 120 can measure the operating speed of the asynchronous processor 150. The frequency reference signal FREF may be, depending on the application, a pulse or square wave with a frequency of 1 Hz, 100 HZ, 10 kHz or some other frequency. The feedback signal FDBK may be an acknowledge signal (ACK) generated by the asynchronous processor 150 to indicate completion of a processing cycle. The feedback signal FDBK may be the output of a critical path estimator (CPE) 155 located on the asynchronous processor chip, where the output of the critical path estimator is representative of the operating speed of the asynchronous processor 150. For example, critical path estimator 155 may be a ring oscillator which has roughly one-half of the number of gates as the critical path through the asynchronous processor 150. The feedback signal FDBK may be some other signal representative of the operating speed of the asynchronous processor 150.

The frequency comparator 120 determines, based on FREF and FDBK, if the processor is operating at a sufficient speed. When the processor is operating too slowly (e.g., FDBK is less than a predefined minimum frequency), frequency comparator 120 outputs an increase signal INC to the pulse generator. The INC signal indicates that the voltage VC should be increased such that the asynchronous processor 150 (and the critical path estimator 155, if present) operate faster. Upon receipt of the INC signal, the charge pump 130 provides a controlled amount of charge ΔQ to the capacitor C, thus raising the voltage VC by an amount equal to ΔQ/C.

The charge pump 130 includes control logic 140, transistor switches Q1 and Q2, and inductor L. The transistor switches Q1, Q2 may be field effect transistors, as shown, or some other type of transistor switch. The transistor switches Q1, Q2 are coupled in series between the supply voltage Vs and ground. The inductor L is connected between a node intermediate the transistor switches Q1, Q2 and the capacitor C. The control logic 140 outputs a first drive signal D1 that turns transistor switch Q1 "on" (i.e., placed in a high conductivity state) for a first time interval. During the first time interval, current flows from VS to capacitor C via transistor switch Q1 and inductor L. The current IL through inductor L increases approximately linearly over the first time interval. After the first time interval, switch Q1 is turned off (i.e., placed in a high resistance state). Immediately subsequent to the first time interval, the control logic 140 outputs a second drive signal D2 that turns transistor switch Q2 "on" for a second time interval. In this context, "immediately subsequent" means "as soon as possible without having both transistor switches Q1, Q2 conducting simultaneously." During the second time interval, the current flow IL through inductor L decreases approximately linearly, transferring energy stored in inductor L to capacitor C. At the end of the second time interval (ideally coincident with the current flow IL falling to zero), transistor switch Q2 is turned off. The voltage VC increases during both the first and second time intervals, resulting in increased operating speed of the asynchronous processor 150. The asynchronous processor 150 then operates from the energy stored in capacitor C until VC has decayed to a voltage where the operating speed is again no longer sufficient, at which time the INC signal is generated and the cycle repeats.

In this example, the amount of charge added to the capacitor C is determined by the duration of the first time interval, the difference between VS and VC, and the inductance of inductor L. The change in the voltage VC is determined by the amount of charge transferred and the capacitance of capacitor C. The minimum required operating speed, the first time interval, and the second time interval may be programmable or configurable for various applications of the processing system 100. For example, the minimum required operating speed, the first time interval, and the second time interval may be determined by data provided by the asynchronous processor 150 or by a controller or other entity (not shown) that manages the activity of the asynchronous process 150 and the frequency-controlled voltage source 110.

The components of the frequency-controlled voltage source 110, including the frequency comparator 120, the pulse generator 140, and optionally transistor switches Q1 and Q2 may be located on the same circuit chip as all or portions of the asynchronous processor 150. The inductor L and the capacitor C may typically be discrete components external to the circuit chip.

Figure 2:
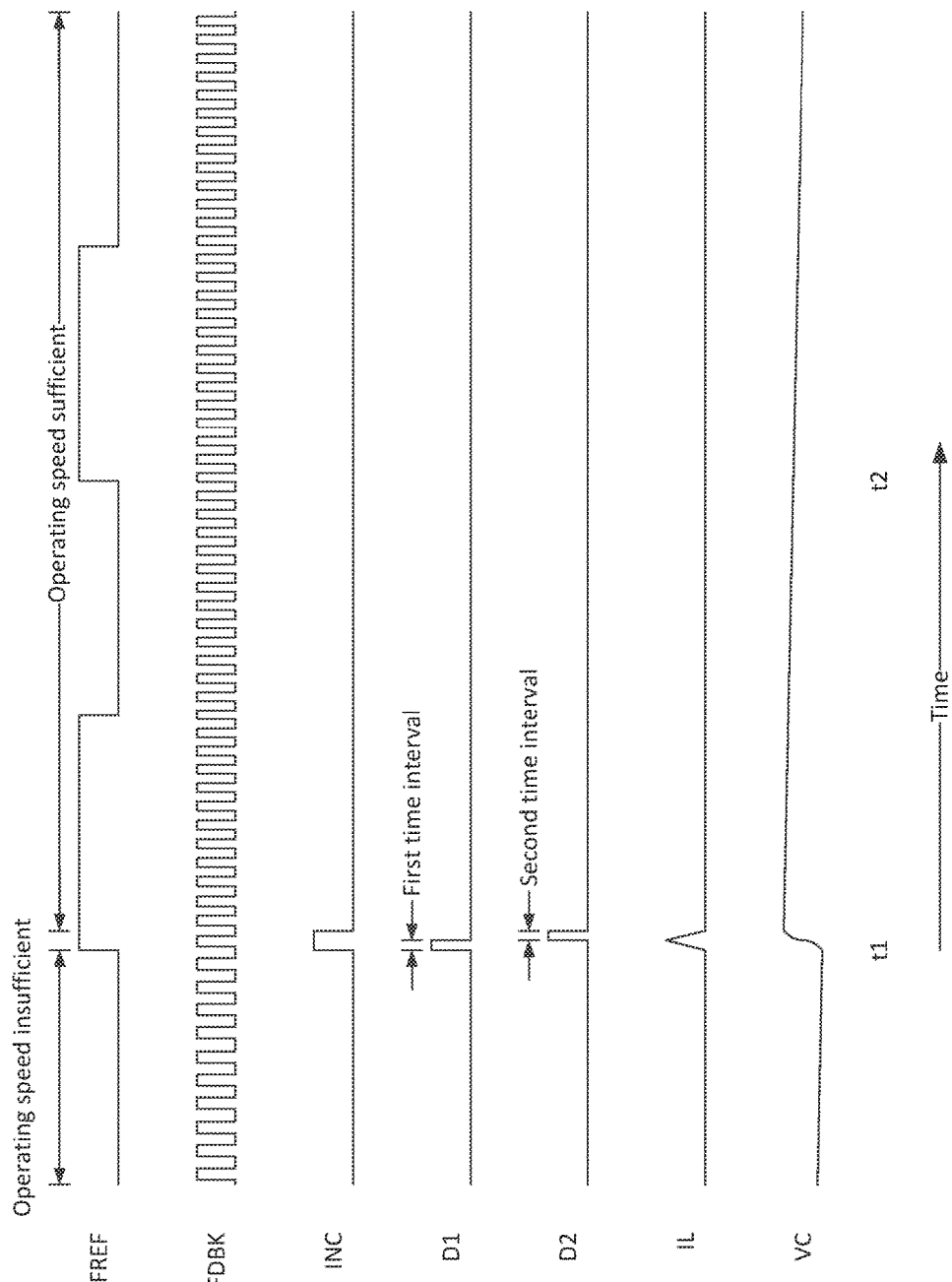
FIG. 2 is a timing diagram for the processing system of FIG. 1.

FIG. 2 is a timing diagram illustrating the operation of the processing system 100. In this example, the frequency comparator determines whether or not the processor operating speed is sufficient coincident with the rising edge of the frequency reference signal FREF. At time t1, a determination is made that the operating speed is insufficient, and the increase signal INC is generated. The pulse generator outputs 140 signal D1 to turn on switch Q1 for a first time interval. The current IL through the inductor L and the voltage VC increase during the first time interval. At the conclusion of the first time interval, the pulse generator 140 generates signal D2 to turn on switch Q2 for a second time interval. The current IL through the inductor L decreases and the voltage VC continues to increase during the second time interval. The processor then operates from the voltage VC stored on the capacitor C.

At time t2 (coincident with the rising edge of the next cycle of FREF) a determination is made that the processor is operating at a sufficient speed. In this case, the INC signal is not generated and the processor continues to operate from the voltage VC stored on the capacitor C. The voltage VC continues to decrease gradually in time until a determination is made that the processor speed is insufficient, and the INC signal is again generated.

Note that the feedback signal FDBK and the frequency reference FREF, need not be locked in frequency or phase. The frequency of feedback signal FDBK is typically not required to be an exact multiple of the frequency of the frequency reference FREF.

Figure 3:
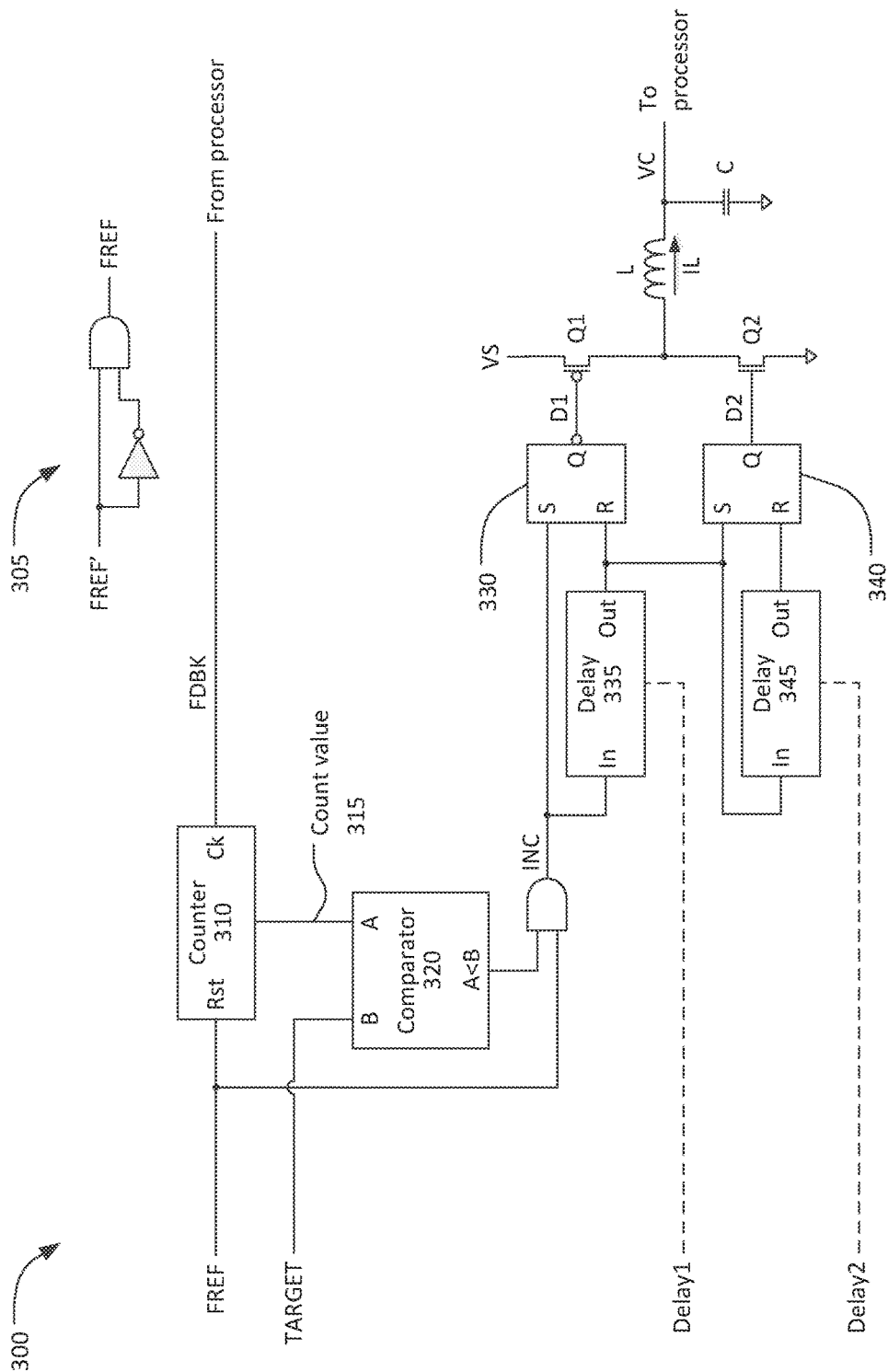
FIG. 3 is a block diagram of a frequency-controlled voltage source.
Figure 4:
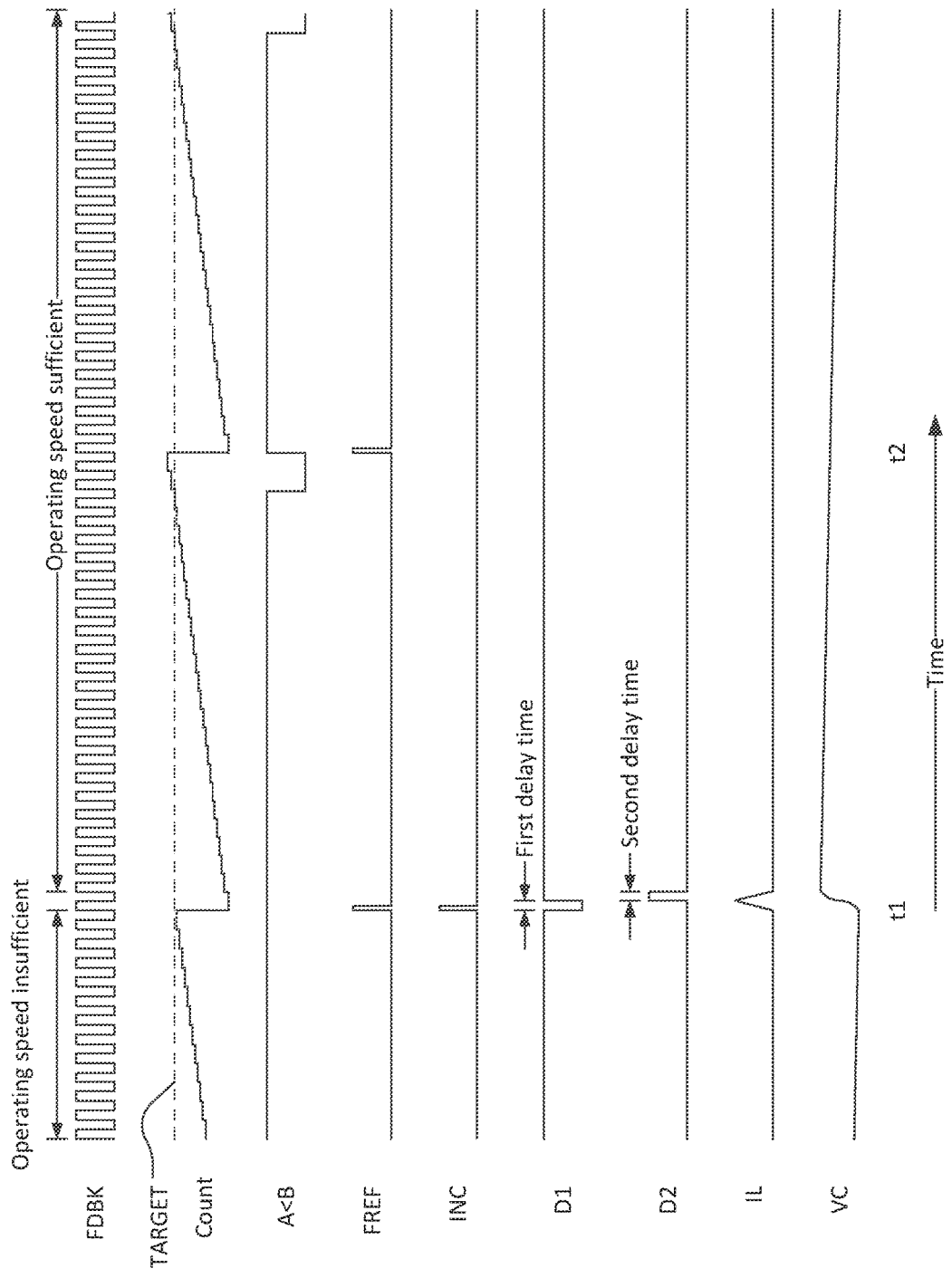
FIG. 4 is a timing diagram for the frequency-controlled voltage source of FIG. 3.

FIG. 3 is a more detailed block diagram of an embodiment of a frequency-controlled voltage source. FIG. 4 is a timing diagram for the system of FIG. 3.

In the embodiment of FIG. 3, a frequency reference signal FREF is a periodic signal having a predetermined period. FREF may be, for example, a train of narrow pulses. FREF may be some other periodic signal, such as a square wave FREF', that is converted into a train of narrow pulses FREF by a digital differentiator circuit 305. The frequency comparator (120 in FIG. 1) is implemented with a counter 310 and a comparator 320. The counter 310 is clocked by a FDBK signal indicative of the operating speed of an asynchronous processor (not shown), which may be the asynchronous processor 150. The counter 310 is periodically reset by FREF. The count value 315 from the counter 310, immediately prior to being reset, indicates a number of cycles of FDBK (rounded down to the nearest integer value) within the period of FREF.

The comparator 320 compares the count value 315 with a target value TARGET. An A<B output from the comparator 320 indicates that the count value 315 is less than the target value. As can be seen at time t1 in FIG. 4, when the processor operating speed is insufficient (i.e. the frequency of FDBK is less than a target frequency), the count value 315 does not reach the target value during the period of FREF. In this case, the logical AND of FREF and A<B provides a pulse signal INC indicating the processor operating voltage VC should be increased. When the processor operating speed is sufficient (e.g. at time t2 in FIG. 4), the count value 315 exceeds the target at the end of the period of FREF, and the INC signal is not generated.

The pulse generator (140 in FIG. 1) is implemented with first and second RS flip flops 330, 340 and first and second delay lines 335, 345. The INC signal sets the first flip flop 330, which outputs a drive signal D1 to turn on transistor switch Q1. A delayed version of INC output from the first delay line 335 resets the first flip flop 330, turning transistor switch Q1 off. The delayed version of INC output from the first delay line 335 also sets the second flip flop 340, which outputs a drive signal D2 to turn on transistor switch Q2. A further delayed version of INC output from the second delay line 345 resets the second flip flop 340, turning transistor switch Q2 off.

As previously described, the current IL through the inductor L and the voltage VC increase during the time period (equal to the delay time of the first delay line 335) when transistor switch Q1 is on. The current IL through the inductor L decreases and the voltage VC continues to increase during the time period (equal to the delay time of the second delay line 345) when transistor switch Q2 is on. The processor then operates from the voltage VC stored on the capacitor C.

Each of the first and second delay lines 335, 345 may be implemented, for example, by a plurality of gates in series. In this case, the delay time is approximately equal to the number of gates in series times an average propagation delay per gate. Each of the first and second delay line 335, 345 may have a fixed or programmable delay time. The delay time of programmable delay lines may be set by respective inputs Delay1, Delay2. For example, each or both of the first and second delay lines 335, 345 may include a plurality of gates in series and a multiplexer, controlled by the respective Delay1 or Delay2 input, to select one of the plurality of gates to provide the output of the delay line.

The target count value TARGET, Delay1, and Delay2 may be programmable or configurable for various applications of the processing system 100. For example, TARGET, Delay1, and Delay2 may be data provided by the asynchronous processor or by a controller or other entity (not shown) that manages the activity of the asynchronous process 150 and the frequency-controlled voltage source 300.

The circuits shown in FIG. 3 are exemplary, and other configurations of a frequency comparator and/or charge pump may be used.

Figure 5:
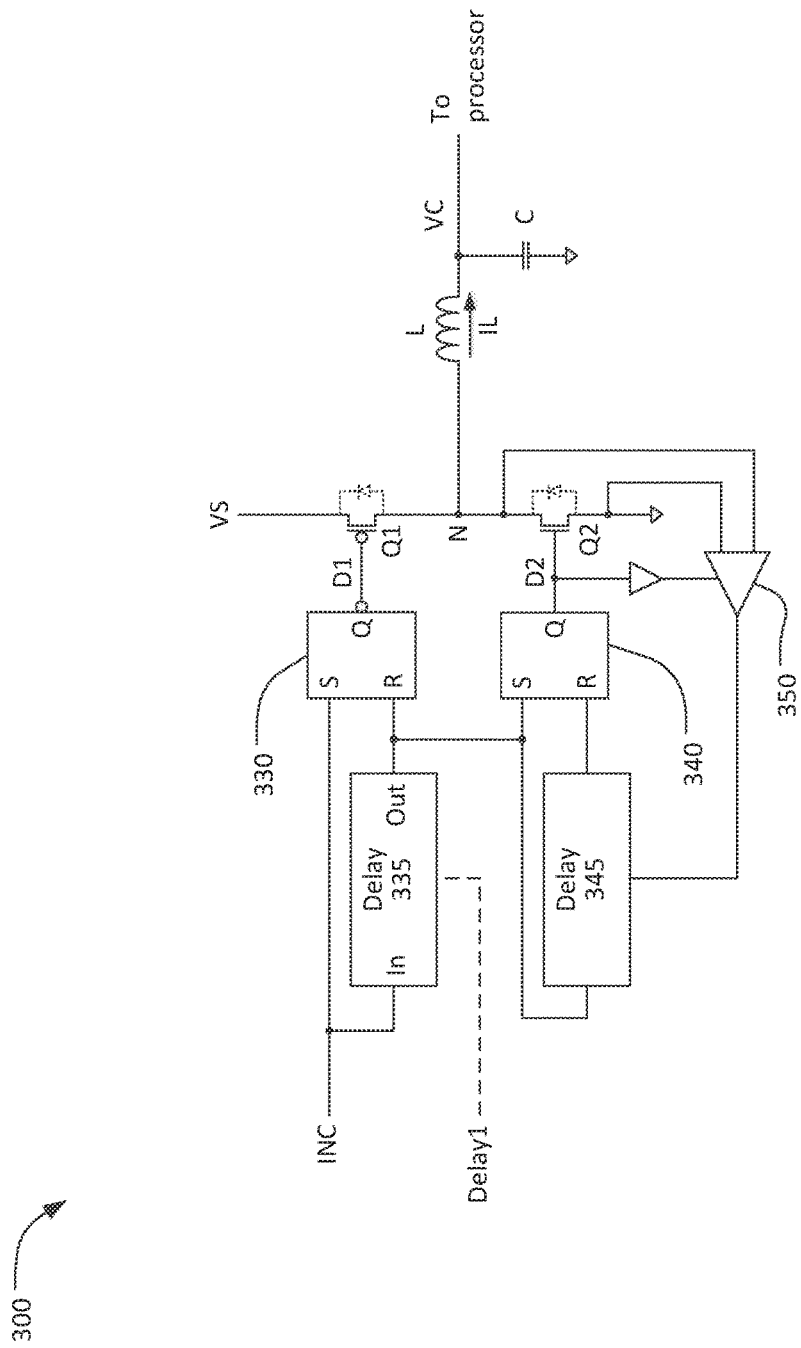
FIG. 5 is a block diagram of a portion of another frequency-controlled voltage source.

FIG. 5 is a block diagram of a portion of another embodiment of a frequency-controlled voltage source. As previously described, a frequency comparator (not shown) generates an INC signal indicating that the processor operating voltage $V_C$ should be increased. The INC signal sets the first flip flop 330, which outputs a drive signal D1 to turn on transistor switch Q1. A delayed version of INC output from the first delay line 335 resets the first flip flop 330, turning transistor switch Q1 off. The delayed version of INC output from the first delay line 335 also sets the second flip flop 340, which outputs a drive signal D2 to turn on transistor switch Q2. A further delayed version of INC from a second delay line 345 resets the second flip flop 340, turning transistor switch Q2 off.

Ideally, transistor switch Q2 should be turned off at the instant the current IL through the inductor L is zero. If Q2 is turned off prematurely, while the current IL is still flowing, the inductor L will force current to flow through the body diode of transistor switch Q2 (shown in dashed lines). This will result in a negative voltage transient at the node N (junction between Q1, Q2, and L) immediately after Q2 turns off. If Q2 is turned off too late, the current IL will have reversed direction. In this case, a positive voltage transient will occur at node N immediately after Q2 turns off.

A latched comparator 350 senses and stores the polarity of the voltage transient. The stored polarity value provides feedback to automatically adjust the delay time of the second delay line 345. For example, the second delay line 345 may include a long series string of buffers. An up/down counter and a multiplexer may be used to select one of the buffers to provide the output of the delay line. The feedback from the comparator 350 may cause the counter to count up or down one step each cycle of the INC signal to automatically converge upon the delay time such that Q2 is turned off very close to the instant the current IL falls to zero.

Description of Methods

Figure 6:
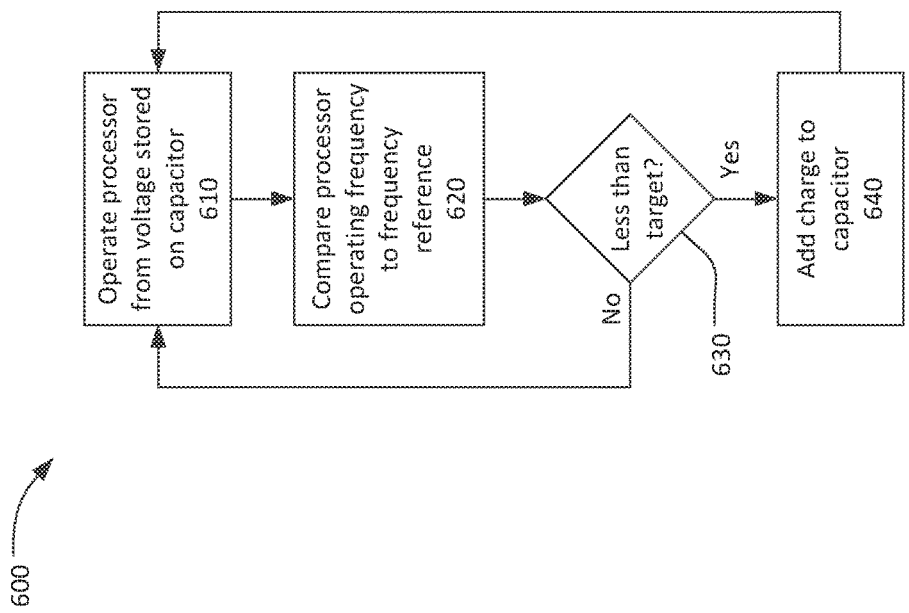
FIG. 6 is a flow chart of a method of operating an asynchronous processor.

FIG. 6 is a flow chart of a method 600 of operating an asynchronous processor. The process 600 does not have a start or a finish, but rather operates continuously so long as a power source is available to power the asynchronous processor. In particular, the action at 610 occurs continuously, and the actions at 620, 630, and 640 occur periodically in parallel with the action at 610.

At 610, an asynchronous processor is operated from a voltage stored on a capacitor. As the asynchronous processor consumes power during its normal operation, the voltage on the capacitor decays, resulting in slower speed operation of the asynchronous processor.

Periodically, an operating frequency of the asynchronous processor is compared to a frequency reference at 620, and a determination is made at 630 whether or not an operating frequency of the asynchronous processor less than a target frequency. Typically, this determination may be made at 630 once each cycle of the target frequency.

When a determination is made that the operating frequency of the asynchronous processor is not less that the target frequency ("No" at 630), no action is taken. When a determination is made that the operating frequency of the asynchronous processor is less that the target frequency ("Yes" at 630), a controlled amount of charge is added to the capacitor at 640. Adding charge raises the voltage stored on the capacitor and correspondingly increases the operating frequency of the asynchronous processor. In either case, the asynchronous processor continues to operate from the voltage stored on the capacitor at 610.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A voltage source circuit, comprising:
   a frequency comparator to compare a frequency reference and a feedback signal indicative of an operating frequency of an asynchronous processor to determine whether or not the operating frequency is less than a target frequency;
   a capacitor adapted to store an operating voltage for the asynchronous processor;
   a charge pump to add charge to the capacitor when a determination is made that the operating frequency is less than the target frequency.

2. The voltage source circuit of claim 1, wherein the frequency comparator comprises:
   a counter to count a number of cycles of the feedback signal within a period of the frequency reference.

3. The voltage source circuit of claim 2, wherein the frequency comparator further comprises:
   a comparator to compare a count value from the counter and a target count value; and
   logic to determine that the operating frequency is less than the target frequency when the count value is less than the target count value at an end of each cycle of the frequency reference.

4. The voltage source circuit of claim 1, wherein the charge pump comprises:
   first and second transistor switches coupled in series between a supply voltage and a ground;
   an inductor coupled between a junction intermediate the first and second transistor switches and the capacitor; and
   control logic that, in response to a determination that the operating frequency is less than the target frequency:
   causes the first transistor switch to turn on for a first time interval,
   causes the first transistor switch to turn off after the first time interval,
   causes the second transistor switch to turn on for a second time interval immediately subsequent to the first time interval, and
   causes the second transistor switch to turn off after the second time interval.

5. The voltage source circuit of claim 4, wherein the control logic comprises:
   a first delay line to determine the first time interval; and
   a second delay line to determine the second time interval.

6. The voltage source circuit of claim 5, wherein one or both of the first delay line and the second delay line are programmable.

7. The voltage source circuit of claim 5, wherein the control logic comprises:
   a comparator to detect a voltage across the second transistor switch after the second transistor switch is turned off, wherein an output of the comparator provides feedback to the second delay line to adjust the second time interval.

8. A processing system, comprising:
   a capacitor storing a voltage;
   an asynchronous processor operating from the voltage stored on the capacitor, the asynchronous processor outputting a feedback signal indicative of an operating frequency of the asynchronous processor;
   a frequency comparator to compare a frequency reference and the feedback signal to determine whether or not the operating frequency of the asynchronous processor is less than a target frequency; and
   a charge pump to add charge to the capacitor when a determination is made that the operating frequency is less than the target frequency.

9. The processing system of claim 8, wherein the feedback signal is an acknowledge signal indicating the completion of a processing cycle of the asynchronous processor.

10. The processing system of claim 8, wherein the feedback signal is an output from a critical path estimator circuit.

11. The processing system of claim 8, wherein the frequency comparator comprises:
   a counter to count a number of cycles of the feedback signal within a period of the frequency reference.

12. The processing system of claim 11, wherein the frequency comparator further comprises:
   a comparator to compare a count value from the counter and a target count value; and
   logic to determine that the operating frequency is less than the target frequency when the count value is less than the target count value at an end of each cycle of the frequency reference.

13. The processing system of claim 8, wherein the charge pump comprises:
   first and second transistor switches coupled in series between a supply voltage and a ground;
   an inductor coupled between a junction intermediate the first and second transistor switches and the capacitor; and
   control logic that, in response to a determination that the operating frequency is less than the target frequency:
   causes the first transistor switch to turn on for a first time interval,
   causes the first transistor switch to turn off after the first time interval, causes the second transistor switch to turn on for a second time interval immediately subsequent to the first time interval, and causes the second transistor switch to turn off after the second time interval.

14. The processing system of claim 13, wherein the control logic comprises:

a first delay line to determine the first time interval; and a second delay line to determine the second time interval.

15. The processing system of claim 14, wherein one or both of the first delay line and the second delay line are programmable.

16. The processing system of claim 14, wherein the control logic comprises:

a comparator to detect a voltage across the second transistor switch after the second transistor switch is turned off, wherein an output of the comparator provides feedback to the second delay line to adjust the second time interval.

17. A method of operating an asynchronous processor, comprising:

operating the asynchronous processor from a voltage stored on a capacitor, the asynchronous processor outputting a feedback signal indicative of an operating frequency of the asynchronous processor;

periodically comparing a frequency reference and the feedback signal to determine whether or not the operating frequency is less than a target frequency; and adding charge to the capacitor when a determination is made that the operating frequency is less than the target frequency.

18. The method of claim 17, wherein the feedback signal is an acknowledge signal indicating the completion of a processing cycle of the asynchronous processor.

19. The method of claim 17, wherein the feedback signal is an output from a critical path estimator circuit.

20. The method of claim 17, wherein periodically comparing the frequency reference and the feedback signal comprises:

comparing the frequency reference and the feedback signal once per cycle of the frequency reference.

21. The method of claim 17, wherein periodically comparing the frequency reference and the feedback signal comprises:

counting a number of cycles of the feedback signal during a period of the frequency reference; and determining the operating frequency is less than the target frequency when the number of cycles of the feedback signal during a period of the frequency reference is less than a target number.

* * * * *